United States Patent
Wang

(10) Patent No.: US 10,139,689 B2
(45) Date of Patent: Nov. 27, 2018

(54) PIXEL STRUCTURE AND LIQUID CRYSTAL PANEL

(71) Applicants: BOE TECHNOLOGY GROUP CO., LTD., Beijing (CN); BEIJING BOE DISPLAY TECHNOLOGY CO., LTD., Beijing (CN)

(72) Inventor: Xiao Wang, Beijing (CN)

(73) Assignees: BOE TECHNOLOGY GROUP CO., LTD, Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 408 days.

(21) Appl. No.: 14/374,251

(22) PCT Filed: Dec. 9, 2013

(86) PCT No.: PCT/CN2013/088869
§ 371 (c)(1),
(2) Date: Jul. 24, 2014

(87) PCT Pub. No.: WO2014/190715
PCT Pub. Date: Dec. 4, 2014

(65) Prior Publication Data
US 2016/0274425 A1    Sep. 22, 2016

(30) Foreign Application Priority Data
May 28, 2013  (CN) .......................... 2013 1 0204168

(51) Int. Cl.
*G02F 1/1343* (2006.01)
*G02F 1/1362* (2006.01)
(Continued)

(52) U.S. Cl.
CPC ...... *G02F 1/136204* (2013.01); *G02F 1/1368* (2013.01); *G02F 1/13624* (2013.01);
(Continued)

(58) Field of Classification Search
CPC ......... G02F 1/136204; G02F 1/134309; G02F 1/13624; G02F 1/136286; G02F 1/1368;
(Continued)

(56) References Cited

U.S. PATENT DOCUMENTS

2003/0142052 A1* 7/2003 Matsumoto .......... G09G 3/3233
345/87
2004/0207784 A1   10/2004 Lim et al.
(Continued)

FOREIGN PATENT DOCUMENTS

CN    1435805 A    8/2003
CN    1538227 A    10/2004
(Continued)

OTHER PUBLICATIONS

International Search Report dated Mar. 13, 2014; PCT/CN2013/088869.
(Continued)

*Primary Examiner* — Nathanael R Briggs
(74) *Attorney, Agent, or Firm* — Ladas & Parry LLP

(57) ABSTRACT

A pixel structure and a liquid crystal panel are disclosed. The pixel structure comprises a data line (1), a pixel electrode (3), a gate line (2), and at least two thin film transistors (4, 5) connected in series between the pixel electrode (3) and the data line (1). The gates of the at least two thin film transistors (4, 5) are connected to the gate line. In the above mentioned pixel structure and the liquid crystal panel, using two thin film transistors (4, 5) connected in series effectively reduces OFF state current, improves the afterimage problem and enhances the display quality of the liquid crystal panel.

13 Claims, 3 Drawing Sheets

(51) Int. Cl.
*G02F 1/1368* (2006.01)
*H01L 27/12* (2006.01)
*H01L 29/786* (2006.01)
*G09G 3/00* (2006.01)
G02F 1/1333 (2006.01)
G02F 1/136 (2006.01)
G09G 3/36 (2006.01)

(52) U.S. Cl.
CPC .. *G02F 1/134309* (2013.01); *G02F 1/136286* (2013.01); *G09G 3/00* (2013.01); *H01L 27/124* (2013.01); *H01L 29/78618* (2013.01); *G02F 2001/13606* (2013.01); *G02F 2001/133397* (2013.01); *G09G 3/3648* (2013.01); *G09G 2320/0214* (2013.01)

(58) Field of Classification Search
CPC ....... G02F 2001/133397; H01L 27/124; H01L 29/78618
See application file for complete search history.

(56) References Cited

U.S. PATENT DOCUMENTS

| | | | |
|---|---|---|---|
| 2007/0181877 A1 | 8/2007 | Lim et al. | |
| 2008/0062345 A1* | 3/2008 | Lee | G02F 1/1393 349/46 |
| 2008/0165302 A1* | 7/2008 | Yasui | G09G 3/3648 349/48 |
| 2009/0026452 A1* | 1/2009 | Miyaguchi | G02F 1/13624 257/59 |
| 2010/0067473 A1 | 3/2010 | Cave et al. | |
| 2012/0099069 A1* | 4/2012 | Yoshiga | G09G 3/3655 349/143 |
| 2013/0010247 A1* | 1/2013 | Wei | G02F 1/13624 349/139 |
| 2013/0135572 A1* | 5/2013 | Park | G02F 1/134336 349/143 |

FOREIGN PATENT DOCUMENTS

| | | |
|---|---|---|
| CN | 101013705 A | 8/2007 |
| CN | 101140396 A | 3/2008 |
| CN | 101738846 A | 6/2010 |
| CN | 101750809 A | 6/2010 |
| CN | 101825814 A | 9/2010 |
| CN | 102456314 A | 5/2012 |
| CN | 202282354 A | 6/2012 |
| CN | 103278990 A | 9/2013 |
| CN | 203241672 U | 10/2013 |
| JP | 2004-126199 A | 4/2004 |
| KR | 200382468 Y1 | 4/2005 |

OTHER PUBLICATIONS

Written Opinion of the International Searching Report dated Mar. 13, 2014; PCT/CN2013/088869.
Second Chinese Office Action dated Aug. 17, 2015; Appln. No. 201310204168.X.
Third Chinese Office Action dated Feb. 15, 2016; Appln. No. 201310204168.X.
First Chinese Office Action dated Mar. 27, 2015; Appln. No. 201310204168.X.
Fourth Chinese Office Action dated Aug. 10, 2016; Appln. No. 201310204168.X.

* cited by examiner

PIXEL STRUCTURE AND LIQUID CRYSTAL PANEL

CROSS REFERENCE TO RELATED APPLICATIONS

This application is based on International Application No. PCT/CN2013/088869 filed on Dec. 9, 2013, which claims priority to Chinese National Application No. 201310204168.X filed on May 28, 2013. The entire contents of each and every foregoing application are incorporated herein by reference.

TECHNICAL FIELD

Embodiments of the present invention relate to a pixel structure and a liquid crystal panel.

BACKGROUND

With the rapid development of liquid crystal display technology, liquid crystal displays have been widely applied in display apparatuses such as notebooks, monitors and TVs. Thin film transistor liquid crystal display (TFT-LCD) is one of the numerous liquid crystal displays. Thin film transistor liquid crystal display is a display in which each liquid crystal pixel point in the liquid crystal panel is driven by a thin film transistor (TFT) integrated behind it such that it's possible to display screen information with high speed, high brightness and high contrast.

In a conventional TFT liquid crystal panel, a connection circuit structure for thin film transistors is shown in FIG. 1. Each pixel structure of the liquid crystal panel includes a data line 1, a gate line 2 and a pixel electrode 3. A thin film transistor 9 is formed at an intersection of the data line 1 and the gate line 2. The thin film transistor 9 has a gate connected to the gate line 2, a source connected to the data line 1, and a drain connected to the pixel electrode 3. An equivalent circuit of the above-mentioned circuit structure is shown in FIG. 2, wherein 11 is a liquid crystal capacitance Clc, and 12 is a storage capacitance Cst.

When the thin film transistor 9 is reversely biased, due to the presence of free electrons attached at the active layer, a tiny current flows through the drain and the source, which is called OFF state current $I_{off}$, also commonly known as leakage current of TFT pixel structure. When designing the TFT pixel structure, an excessive large OFF state current would cause some problems. For example, if the OFF state current is too large, the pixel voltage sustaining characteristic will be affected to a certain extent, that is, the sustained voltage drops too fast when the gate is off to cause a changes over 2 gray-scales recognizable for the human eye, which would cause flicking. Further, if the OFF state current is too large, residual DC component increases when the pixel is discharged, causing charge residual and an afterimage.

SUMMARY

In one embodiment of the present invention, a pixel structure is provided. The pixel structure comprises a data line, a pixel electrode, a gate line, and at least two thin film transistors connected in series between the pixel electrode and the data line. The at least two thin film transistors having their gates connected to the gate line.

In another embodiment of the present invention, a liquid crystal panel is provided comprising the pixel structure described as above.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

Figure 1:
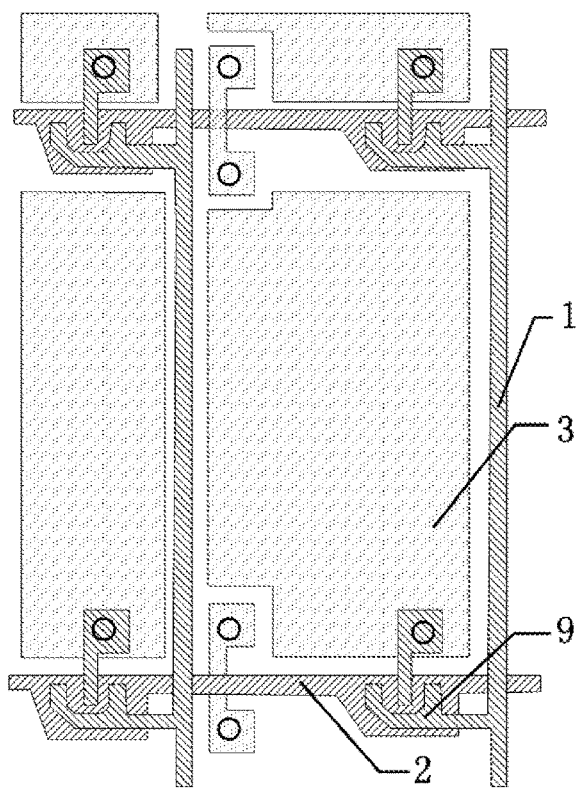
FIG. 1 is a structure diagram of connecting circuits of a thin film transistor in a conventional pixel structure.
Figure 2:
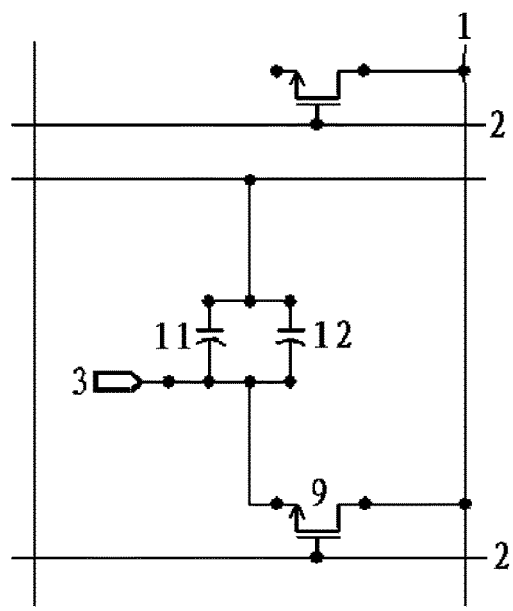
FIG. 2 is a equivalent circuit diagram of the connecting circuits of the thin film transistor in the conventional pixel structure.

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

Embodiments of the present invention provide a pixel structure and a liquid crystal panel including the pixel structure that can effectively reduce OFF state current, improve afterimage problem and enhance display quality of liquid crystal panels.

In conventional thin film transistor liquid crystal displays (TFT-LCDs), major parameters of thin film transistors are ON current Ion, OFF state current Ioff, drain source voltage Vds, gate source voltage Vgs and threshold voltage $V_{TH}$, wherein Ion, Ioff and $V_{TH}$ have major influence on the pixels. The ON current Ion is calculated using following formula:

$$I_{on} = \frac{W}{L}\mu_n C_{SiNx}(V_G - V_{TH})V_D$$

where W and L are width and length of the channel formed by the active layer of the thin film transistor, $\mu_n$ is an effective electron mobility, $C_{SiNx}$ is a capacitance of thin film transistor, $V_{TH}$ is a threshold voltage of the thin film transistor, $V_G$ and $V_D$ are voltages of gate and drain relative to source of the thin film transistor. As can be seen from the above formula, factors that influence the on current Ion are the width to length ratio of channel W/L and the electron mobility, etc.

The OFF state current Ioff is calculated using following formula:

$$I_{off} = q(n\mu_n + \rho\mu_p)\frac{W}{L}V_D$$

where q is an amount of electronic charges, n is an electron density, $\mu_n$ is the effective electron mobility, ρ is a hole density, $\mu_\rho$ is a hole mobility, W and L are the width and length of the channel formed by the active layer of the thin film transistor, $V_D$ is the voltage of drain relative to source of the thin film transistor.

Thus it can be seen that factors influencing OFF state current Ioff are the width to length ratio of channel W/L etc. Therefore, in pixel structure design, it is possible to adjust Ion and Ioff by adjusting the width to length ratio W/L of the thin film transistor.

The first aspect of embodiments of the present invention provides a pixel structure including a data line, a pixel electrode and a gate line, as well as at least two thin film transistors connected in series between the pixel electrode and the data line, and the at least two thin film transistors have gates all connected to the gate line. The above-mentioned technical solution replaces a single thin film transistor with two cascaded thin film transistors, so as to effectively reduce OFF state current and improve the after-image problem.

Figure 3:
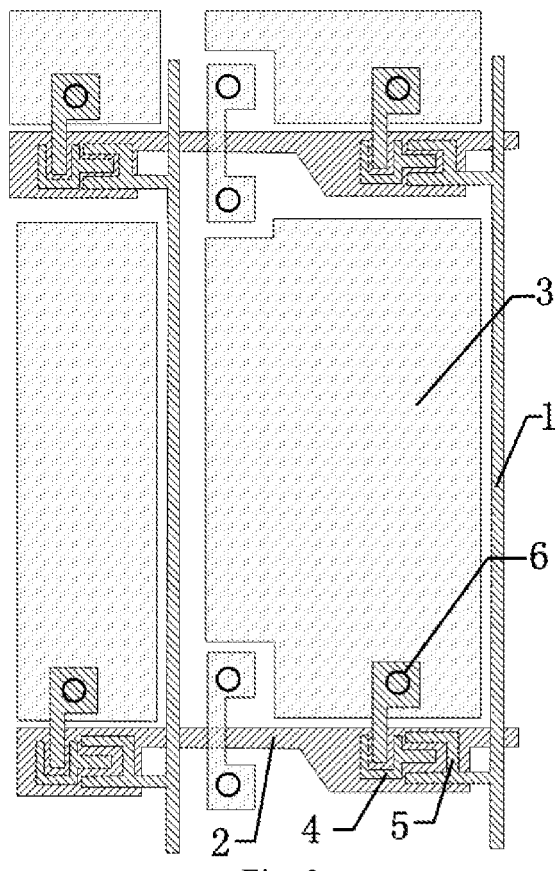
FIG. 3 is a structure diagram of connecting circuits of dual thin film transistors in a pixel structure according to an embodiment of the present invention.

Specifically, as shown in FIG. 3, the pixel structure according to one embodiment of the present invention includes a data line 1, a pixel electrode 3 and a gate line 2, a first thin film transistor 5 and a second thin film transistor 4. The drain of the first thin film transistor 5 is connected with the source of the second thin film transistor 4, the source of the first thin film transistor 5 is connected with the data line 1, and the drain of the second thin film transistor 4 is connected with the pixel electrode 3 through a via 6.

Figure 4:
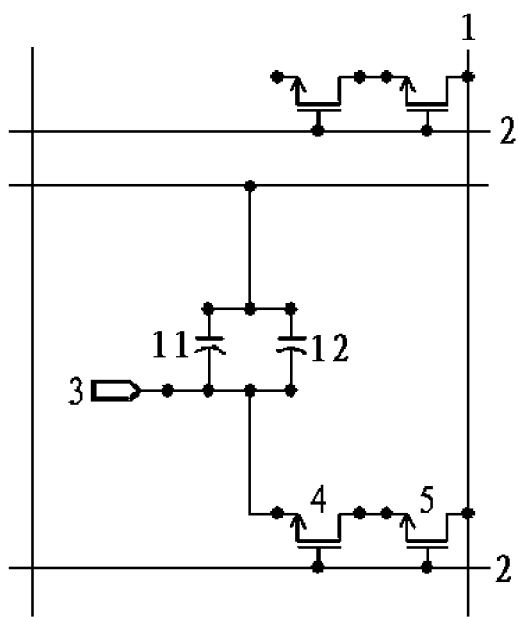
FIG. 4 is an equivalent circuit diagram of connecting circuits of dual thin film transistors in the pixel structure according to the embodiment of the present invention.

An equivalent circuit of the pixel structure shown in FIG. 3 is shown in FIG. 4, in which 11 is a liquid crystal capacitance Clc and 12 is a storage capacitance Cst. As can be seen from FIG. 4, in the embodiments of the present invention, two cascaded thin film transistors are used to replace a conventional single thin film transistor. The advantages of this pixel structure design are due to the following. By cascading two identical thin film transistors while controlling channel length, the two thin film transistors are turned on at the same time, when the gate line 2 is turned on. Since the two thin film transistors have the same ON currents as the ON current of the single thin film transistor, there will be no significant influence on the voltage of data line 1. When the gate line 2 is turned off, the OFF state current Ioff is significantly reduced by reversely biasing the two thin film transistors, which greatly improves the after-image problem and improves the display quality of liquid crystal panels.

The first thin film transistor 5 and the second thin film transistor 4 may be formed synchronously in the same process.

In one embodiment of the present invention, the drain and the source of the first thin film transistor 5, the drain and the source of the second thin film transistor 4, and the data line 1 are all formed of the source-drain electrode layer, the active layer of the first thin film transistor 5 and the active layer of the second thin film transistor 4 are both formed of the semiconductor layer, and the gate of the first thin film transistor 5, the gate of the second thin film transistor 4 and the gate line 2 are all formed of the gate line layer.

Of course, when the first thin film transistor 5 and the second thin film transistor 4 are thin film transistors with the same shape and size, the two thin film transistors have the same ON state current, and the OFF state current may be reduced without changing the ON state current, hence achieving a optimized effect.

In order to reduce the influence on aperture ratio of the pixel structure, the following measures may be taken:

I. The gates of the first thin film transistor and the second thin film transistor are formed of the gate line, and the active layers, the sources and the drains of the first thin film transistor and the second thin film transistor are formed over the gate line.

II. The first thin film transistor and the second thin film transistor overlap at least in part with the gate line or the data line in their locations.

III. The sources of the first thin film transistor and the second thin film transistor have a U shape, drains of the first thin film transistor and the second thin film transistor have a I shape, and the U shaped source partially surrounds one end of I shaped drain.

Of course, the pixel structure provided in embodiments of the present invention may further include a common electrode line connecting common electrodes of pixels.

When the pixel structure provided in embodiments of the present invention is used in large scale thin film transistor liquid crystal displays, due to the large size of pixel structures, even if cascading two thin film transistors will not significantly influence the aperture ratio of the pixel structure, hence obtaining the best technological effect.

Figure 5:
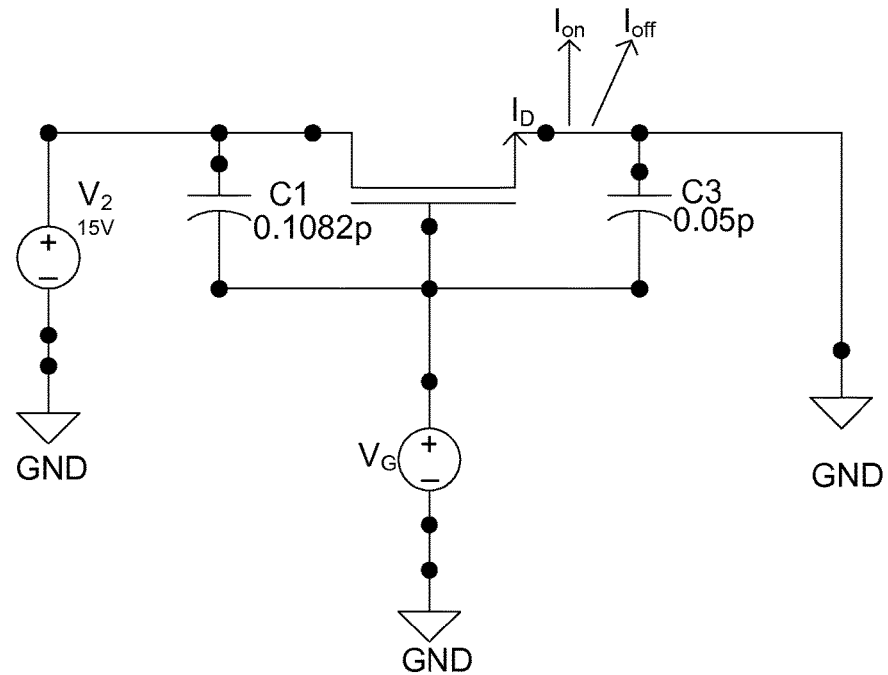
FIG. 5 is a circuit structure diagram of a single TFT circuit simulated using Smart Spice.
Figure 6:
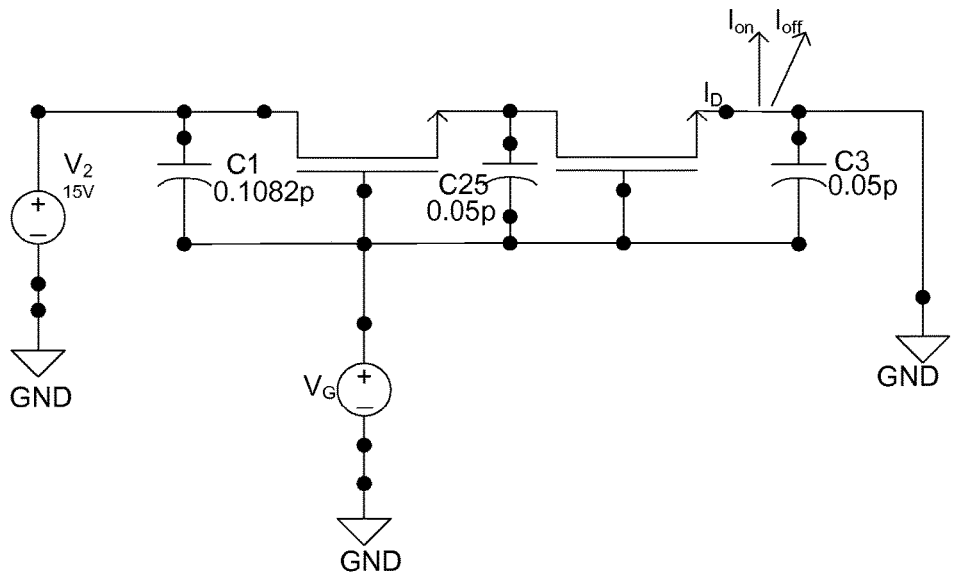
FIG. 6 is a circuit structure diagram of dual TFTs circuits simulated using Smart Spice.

In order to further verify the technological effect of reducing OFF state current Ioff of the pixel structure according to embodiments of the present invention, influence of a single TFT circuit and a dual TFT circuit on Ion and Ioff are verified by analog simulation with the Smart Spice software in embodiments of the present invention. The analog circuit diagram for a single TFT circuit is shown in FIG. 5, and the analog circuit diagram for a dual TFTs circuit is shown in FIG. 6, in which $V_G$ is the supply voltage, and the simulation results obtained are as follows:

I. when Ion≈6 μA
When VG=27V:
In the single TFT circuit, W/L=68/9.8, Ion=5.981,
In the dual TFT circuit, W/L=68/4.9, Ion=5.986;
When VG=−8V:
In the single TFT circuit, Ioff=19.915 pA;
In the dual TFT circuit, Ioff=10.307 pA;
II. when Ion≈7 μA
When VG=27V:
In the single TFT circuit, W/L=80/9.8, Ion=7.036;
In the dual TFT circuit, W/L=68/4.9, Ion=7.042;
When VG=−8V:
In the single TFT circuit, Ioff=23.429 pA;
In the dual TFT circuit, Ioff=12.125 pA;

As can be seen from the above mentioned simulation results, it is possible to make the on currents Ion of dual TFT circuit and single TFT circuit substantially the same while OFF state currents Ioff are reduced by about one half by adjusting the channel length L.

As can be seen further from the above mentioned simulation results, designing two identical TFTs with identical Ion by controlling the channel length L on the gate line of a pixel does not affect the aperture ratio of the pixel structure too much, and does not affect normal display of the liquid crystal panel, and can reduce Ioff.

As can be seen from the above mentioned embodiments and simulation results of simulation experiments, adopting the above-mentioned pixel structure of embodiments can effectively reduce OFF state current and improve afterimage problem. A liquid crystal panel using this pixel structure can in turn generate a display effect better than a conventional liquid crystal panel. Here, the liquid crystal panel may use various display modes such as twisted nametic (TN) mode, vertical alignment (VA) mode, in plane switching (IPS) mode, advanced super dimensional field switching (ADS) mode.

Furthermore, although in the above-mentioned embodiments, for the convenience of description, an example is explained in which the source of the thin film transistor is connected to the data line while the drain of the thin film transistor is connected to the pixel electrode, however, those skilled in the art should understand, that for a thin film transistor, the source and the drain are interchangeable in their structure, and therefore it is possible to connect the source to the pixel electrode and connect the drain to the data line, which is included within embodiments of the present invention.

Furthermore, although in the above-mentioned embodiments, explanation has been given with respect to the case in which two thin film transistors are connected in series, embodiments of the present invention are not limited to two thin film transistors connected in series, and more thin film transistors connected in series are possible.

The above embodiments only serve to explain the technical solution of the present invention rather than limiting it; though the present invention has be described in detail with reference to the aforementioned embodiments, those of ordinary skill in the art should understand that they can still make modifications to the technical solution recited in the aforementioned various embodiments or make equivalent substitutions to partial technical features therein; and all these modifications or substitutions will not make the nature of respective technical solutions to depart from the spirit and scope of the technical solutions of embodiments of the present invention.

What is claimed is:

1. A pixel structure comprising a data line, a pixel electrode, a gate line, and at least two thin film transistors connected in series between the pixel electrode and the data line, the at least two thin film transistors having their gates connected to the gate line,
   wherein the at least two thin film transistors are thin film transistors with a same shape and size,
   wherein each of the at least two thin film transistors comprises a gate which is formed of a portion of the gate line; an active layer, a source and a drain which are all formed over the portion of the gate line; and an extension direction of the portion of the gate line intersects with an extension direction of the data line;
   the thin film transistors comprise a first thin film transistor and a second thin film transistor, the first thin film transistor comprises a first U-shaped source and a first I-shaped drain, and the first U-shaped source partially surrounds one end of the first I-shaped drain;
   the second thin film transistor comprises a second U-shaped source and a second I-shaped drain, and the second U-shaped source partially surrounds one end of the second I-shaped drain; and
   the first I-shaped drain is connected with the second U-shaped source of the second thin film transistor and is also extended from the second U-shaped source of the second thin film transistor of the second thin film transistor.

2. The pixel structure of claim 1, wherein the first U-shaped source of the first thin film transistor is connected with the data line, and the second I-shaped drain of the second thin film transistor is connected with the pixel electrode.

3. The pixel structure of claim 2, wherein the first thin film transistor and the second thin film transistor are formed synchronously in a same process.

4. The pixel structure of claim 2, wherein the first I-shaped drain and the first U-shaped source of the first thin film transistor, the second I-shaped drain and the second U-shaped source of the second thin film transistor, and the data line are all formed of a source/drain electrode layer, an active layer of the first thin film transistor and an active layer of the second thin film transistor are both formed of a semiconductor layer, and the gate line is formed of a gate line layer.

5. The pixel structure of claim 2, wherein the first thin film transistor and the second thin film transistor overlap at least in part with the gate line or the data line in their locations.

6. The pixel structure of claim 1, further comprising a common electrode line connecting common electrodes of respective pixels.

7. A liquid crystal panel comprising a pixel structure,
   the pixel structure comprising a data line, a pixel electrode, a gate line, and at least two thin film transistors connected in series between the pixel electrode and the data line, the at least two thin film transistors having their gates connected to the gate line,
   wherein the at least two thin film transistors are thin film transistors with a same shape and size,
   wherein each of the at least two thin film transistors comprises a gate which is formed of a portion of the gate line; an active layer, a source and a drain which are all formed over the portion of the gate line; and an extension direction of the portion of the gate line intersects with an extension direction of the data line;
   the thin film transistors comprise a first thin film transistor and a second thin film transistor, the first thin film transistor comprises a first U-shaped source and a first I-shaped drain, and the first U-shaped source partially surrounds one end of the first I-shaped drain;
   the second thin film transistor comprises a second U-shaped source and a second I-shaped drain, and the second U-shaped source partially surrounds one end of the second I-shaped drain; and
   the first I-shaped drain is connected with the second U-shaped source of the second thin film transistor and is also extended from the second U-shaped source of the second thin film transistor of the second thin film transistor.

8. The liquid crystal panel of claim 7, wherein the first U-shaped source of the first thin film transistor is connected with the data line, and the second I-shaped drain of the second thin film transistor is connected with the pixel electrode.

9. The liquid crystal panel of claim 8, wherein the first thin film transistor and the second thin film transistor are formed synchronously in a same process.

10. The liquid crystal panel of claim 8, wherein the first I-shaped drain and the first U-shaped source of the first film transistor, the second I-shaped drain and the second U-shaped source of the second thin film transistor, and the data line are all formed of a source/drain electrode layer, an active layer of the first thin film transistor and an active layer of the second thin film transistor are both formed of a semiconductor layer, and the gate is formed of a gate line layer.

11. The liquid crystal panel of claim 8, wherein the first thin film transistor and the second thin film transistor overlap at least in part with the gate line or the data line in their locations.

12. The liquid crystal panel of claim 7, further comprising a common electrode line connecting common electrodes of respective pixels.

13. The pixel structure according to claim 2, wherein openings of the first U-shaped source and the second U-shaped source face different directions.

* * * * *